US009196474B2

(12) United States Patent
Knapp et al.

(10) Patent No.: US 9,196,474 B2
(45) Date of Patent: Nov. 24, 2015

(54) METAL AMIDE DEPOSITION PRECURSORS AND THEIR STABILIZATION WITH AN INERT AMPOULE LINER

(71) Applicant: Applied Materials, Inc., Santa Clara, CA (US)

(72) Inventors: David Knapp, Santa Clara, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/193,088

(22) Filed: Feb. 28, 2014

(65) Prior Publication Data

US 2014/0242806 A1 Aug. 28, 2014

Related U.S. Application Data

(60) Provisional application No. 61/770,786, filed on Feb. 28, 2013.

(51) Int. Cl.
| | |
|---|---|
| H01L 21/31 | (2006.01) |
| H01L 21/02 | (2006.01) |
| C23C 16/34 | (2006.01) |
| C23C 16/448 | (2006.01) |
| C23C 16/455 | (2006.01) |

(52) U.S. Cl.
CPC .......... *H01L 21/02175* (2013.01); *C23C 16/34* (2013.01); *C23C 16/4481* (2013.01); *C23C 16/45536* (2013.01); *C23C 16/45553* (2013.01); *H01L 21/02183* (2013.01); *H01L 21/02194* (2013.01)

(58) Field of Classification Search
CPC ............. H01L 21/02175; H01L 21/02183; H01L 21/02194; C23C 16/18; C23C 16/34; C23C 16/4402; C23C 16/4481; C23C 16/4482; C23C 16/4487; C23C 16/45544
USPC ............................ 438/758; 118/715, 723 VE
See application file for complete search history.

(56) References Cited

U.S. PATENT DOCUMENTS

| | | | |
|---|---|---|---|
| 5,186,718 | A | 2/1993 | Tepman et al. |
| 7,597,758 | B2 | 10/2009 | Chen et al. |
| 7,748,400 | B2 | 7/2010 | Nakashima et al. |
| 2007/0281083 | A1 | 12/2007 | Lakshmanan et al. |
| 2008/0213476 | A1 | 9/2008 | Spohn et al. |
| 2008/0216743 | A1* | 9/2008 | Chen et al. ............... 118/719 |
| 2009/0191338 | A1 | 7/2009 | Matsumoto et al. |
| 2009/0314370 | A1* | 12/2009 | Nakashima et al. ......... 137/861 |
| 2012/0216712 | A1 | 8/2012 | Paranjpe et al. |
| 2013/0019960 | A1 | 1/2013 | Choi et al. |

FOREIGN PATENT DOCUMENTS

WO    WO-2012/059881    5/2012

OTHER PUBLICATIONS

PCT International Search Report and Written Opinion in PCT/US2014/019495, mailed Jun. 9, 2014, 13 pages.
Horvath, B. et al., Manganese(II) Silylamides, Z. Anorg. Allg. Chem. vol. 450 1979, 165-177.
Kurokawa, Atsuko et al., Simultaneous formation of a metallic Mn layer and an MnOx / MnSixOy barrier layer by chemical vapor deposition at 250° C., 2 pages.
Vehkamäki, Marko et al., Bismuth precursors for atomic layer deposition of bismuth-containing oxide films, *J. Mater. Chem.* vol. 14 2004, 3191-3197.

* cited by examiner

*Primary Examiner* — Brook Kebede
(74) *Attorney, Agent, or Firm* — Servilla Whitney LLC

(57) ABSTRACT

Described are methods and apparatuses for the stabilization of precursors, which can be used for the deposition of manganese-containing films. Certain methods and apparatus relate to lined ampoules and/or 2-electron donor ligands.

6 Claims, 6 Drawing Sheets

METAL AMIDE DEPOSITION PRECURSORS AND THEIR STABILIZATION WITH AN INERT AMPOULE LINER

CROSS-REFERENCE TO RELATED APPLICATIONS

This application claims priority to U.S. Provisional Application No. 61/770,786, filed Feb. 28, 2013, the entire contents of which are herein incorporated by reference.

FIELD

Embodiments of the present invention relate generally to film deposition. More particularly, embodiments of the invention relate to the stabilization of precursors during film deposition processes.

BACKGROUND

Integrated circuits have evolved into complex devices that include millions of transistors, capacitors, and resistors on a single chip. The evolution of chip design continually requires faster circuitry and greater circuit density demanding increasingly precise fabrication processes. The precision processing of substrates requires precise control of temperature, rate, and pressure in the delivery of fluids used during processing.

Chemical vapor deposition (CVD) and atomic layer deposition (ALD) are two deposition processes used to form or deposit various materials on a substrate. In general, CVD and ALD processes involve the delivery of gaseous reactants to the substrate surface where a chemical reaction takes place under temperature and pressure conditions favorable to the thermodynamics of the reaction.

Many such deposition processes utilize a heated vessel or canister, such as an ampoule or bubbler, which contains a volatile liquid precursor under conditions conducive to vaporize the precursor. However, a common problem with the deposition of thin films is that many precursors have limited stability inside the ampoule. This is especially the case with metal precursors having low coordination number, as the metal center is more vulnerable to reaction with other compounds. The complex may react with impurities, decomposition products, or even the metal surface of the ampoule itself. Without increasing stability of the precursors, throughput of the deposition tool is diminished, or, worse yet, the process conditions may need to be completely re-engineered to inhibit decomposition and/or unwanted reactions. Accordingly, there is a need for additional apparatuses and methods of stabilizing metal precursors.

SUMMARY

One aspect of the invention relates to an apparatus for generating a chemical precursor gas. The apparatus comprises a canister having a sidewall, a top, and a bottom forming an interior volume; an inlet port and an outlet port in fluid communication with the interior volume; a lining on at least part of the sidewall, top or bottom, wherein the lining comprises an inert metal oxide; and a precursor in the interior volume of the canister, wherein the precursor contains at least one Mn—N bond and a 2-electron donor ligand. In one or more embodiments, the lining is on at least part of the bottom. In some embodiments, the inert metal oxide comprises a dielectric. In one or more embodiments, the inert metal oxide comprises $SiO_2$, $Al_2O_3$, $TiO_2$, silicon carbide, silicon oxycarbide or $Ta_2O_5$. In some embodiments, the 2-electron donor ligand comprises pyridine, tetrahydrofuran or tetrahydrothiophene, tetramethylethylenediamine, acetonitrile, a tertiary amine or 2,2'-bipyridyl. In one or more embodiments, the precursor has a structure represented by:

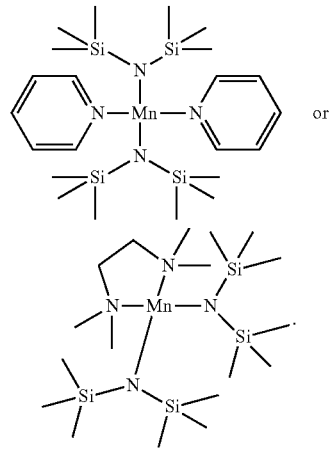

Another aspect of the invention relates to a method of depositing a manganese-containing film. The method comprises providing a precursor containing at least one Mn—N bond; and flowing the precursor through an apparatus for generating a chemical precursor gas, wherein the apparatus has a lining comprising an inert metal oxide. In one or more embodiments, the inert metal oxide comprises a dielectric. In some embodiments, the inert metal oxide comprises $SiO_2$, $Al_2O_3$, $TiO_2$, silicon carbide, silicon oxycarbide or $Ta_2O_5$. In one or more embodiments, the precursor has a structure represented by:

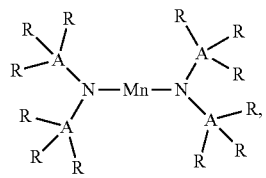

wherein each A is independently selected from carbon or silicon and each R is independently selected from hydrogen, methyl, substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics.

In one or more embodiments, each A is silicon. In some embodiments, each R group is a methyl. In one or more embodiments, the precursor comprises manganese bis[bis(trimethylsilyl)amide]. In some embodiments, the method further comprises exposing a substrate surface to the manganese bis[bis(trimethylsilyl)amide] and to a second precursor comprising $NH_3$. In one or more embodiments, the precursor further contains a 2-electron donor ligand. In some embodiments, the 2-electron donor ligand comprises pyridine, tetrahydrofuran or tetrahydrothiophene, tetramethylethylenediamine, acetonitrile, a tertiary amine or 2,2'-bipyridyl. In one or more embodiments, the at least Mn—N bond is part of the 2-electron donor ligand. In some embodiments, the precursor has a structure represented by:

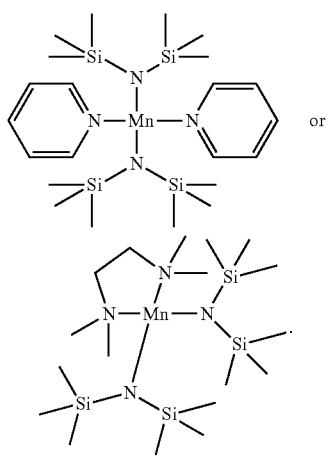

In one or more embodiments, the method further comprises exposing a substrate surface to the precursor.

Another aspect of the invention pertains to a method of depositing a manganese-containing film, the method comprising: exposing a substrate surface to the vaporized precursor, wherein the precursor comprises:

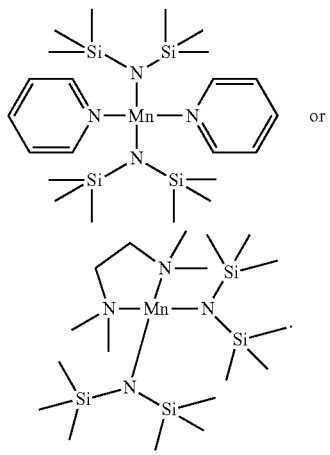

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
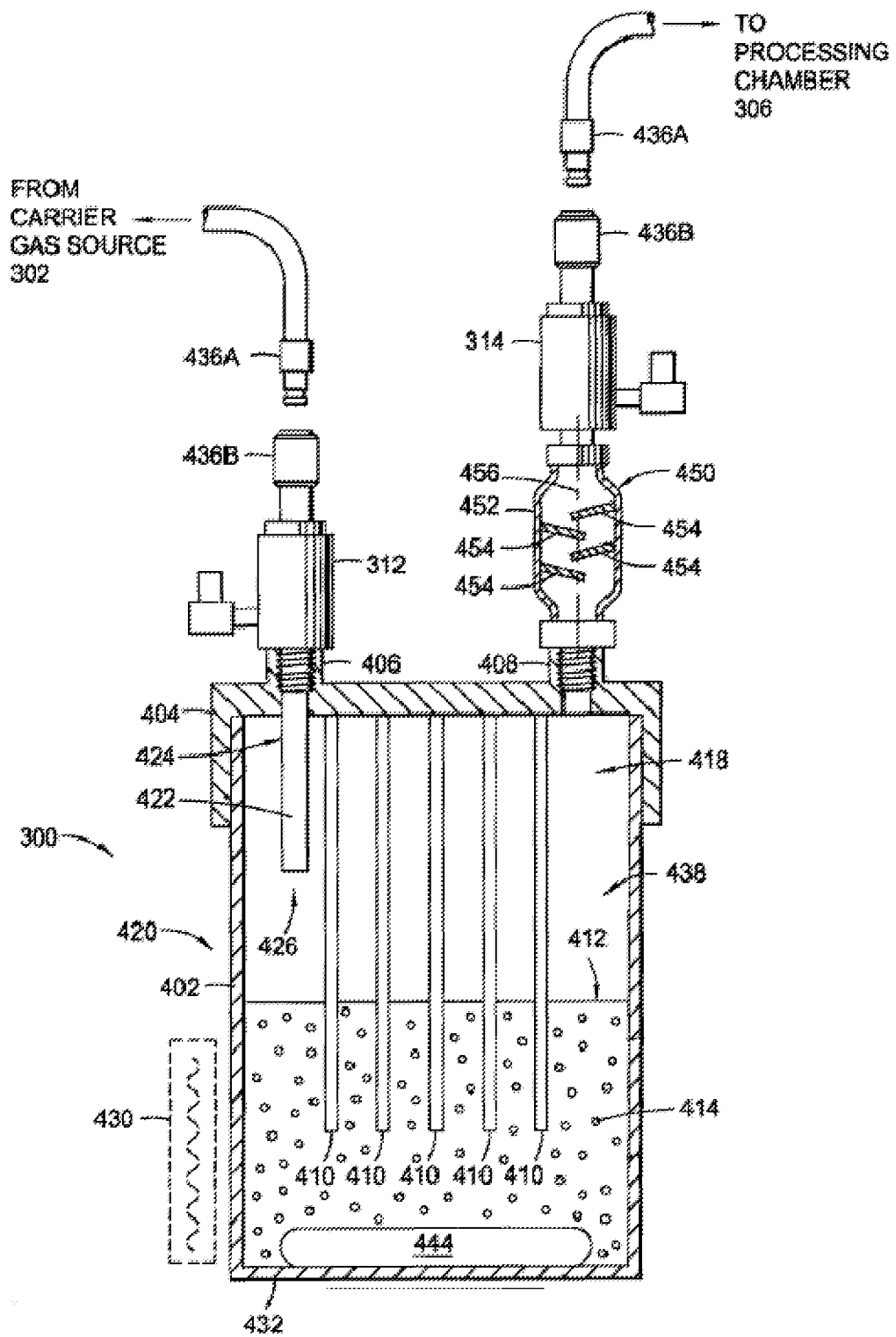
FIG. 1 is a sectional sideview of one exemplary embodiment of an apparatus according to one or more embodiments of the invention.

Before describing several exemplary embodiments of the invention, it is to be understood that the invention is not limited to the details of construction or process steps set forth in the following description. The invention is capable of other embodiments and of being practiced or being carried out in various ways It has been discovered that Mn precursors can be stabilized by modification of ligands and/or modification of the equipment utilized during film deposition processes. As discussed above, precursors can react with the inner walls of the ampoule, which can be made of, for example, stainless steel. However, lining the inner walls of ampoules with an inert metal oxide can help prevent reaction of a precursor. Additionally, the precursors can be synthesized so that the precursors are coordinated to amide ligands that also contain a 2-electron donor moiety, or a separate 2-electron donor ligand may be added, thus providing chemical stability. The apparatuses and processes described herein help to stabilize metallorganics (i.e precursors) which may be subject to degradation at elevated temperatures.

Accordingly, aspects of the invention provide the enhanced stability that prevents precursor degradation during a production run. An increase in precursor stability means that throughput of the deposition tool can be increased, all while avoiding having to re-engineer the process conditions.

Apparatus

One aspect of the invention relates to an apparatus for generating a chemical precursor gas, which in some embodiments, is referred to as an ampoule. The apparatus comprises a canister having a sidewall, a top, and a bottom forming an interior volume; an inlet port and an outlet port in fluid communication with the interior volume; a lining on at least part of the sidewall, top or bottom, wherein the lining comprises an inert metal oxide; and a precursor in the interior volume of the canister, wherein the precursor contains at least one Mn—N bond and a 2-electron donor ligand. In one or more embodiments, the lining is on at least part of the bottom. In some embodiments, the apparatus is an on-board reservoir containing metallorganics. In one or more embodiments, the apparatus contains a heating element to heat the precursors.

Variants of the apparatus include different lining materials. In some embodiments, for example, the inert metal oxide comprises a dielectric. In further embodiments, the inert metal oxide comprises $SiO_2$, $Al_2O_3$, $TiO_2$, silicon carbide, silicon oxycarbide or $Ta_2O_5$. In one or more embodiments, the inert metal oxide is silicon-based.

In some embodiments, the 2-electron donor ligand is a ligand that helps to stabilize the precursor. In some embodiments, the Mn—N bond is a part of the 2-electron donor ligand. In one or more embodiments, the 2-electron donor ligand comprises a pyridine (py), tetrahydrofuran (THF), tetrahydrothiophene, tetramethylethylenediamine (TMEDA) ligand, acetonitrile, a tertiary amine or 2,2'-bipyridyl. In some embodiments, the precursor contains trimethylsilyl amides (TMSA) ligands. In further embodiments, the precursor has a structure represented by:

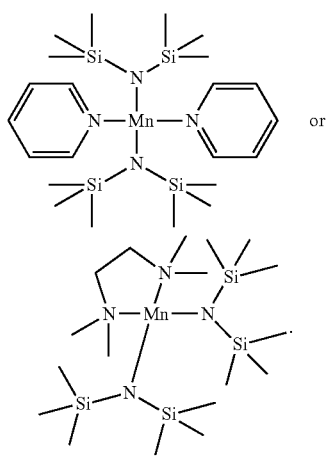

The stabilized precursors described herein may be synthesized according to the methods described in Horvath, et al., "Manganese(II) silylamides," which specifically described the synthesis of Mn(TMSA)$_2$(THF). MnCL$_2$ and LiN(SiMe$_3$)$_2$ in THF was utilized to produce the precursor. The process may be adapted to other ligands and using parallel process.

The ampoule is advantageously lined, as its inner surfaces can remain in contact with deposition chemicals for an extended period of time. Thus, in one or more embodiments, only the ampoule of a deposition chamber system is lined. Although valves and lines may not have extended contact with deposition chemicals, they may also be coated in one or embodiments of the invention.

FIG. 1 depicts sectional views of one embodiment of the apparatus, alternately referred to as a "source canister" 300. The source canister" 300 is generally coupled between a carrier gas source 302 and the processing chamber 306. The source canister 300 generally comprises an ampoule or other sealed container having a housing 420 that is adapted to hold precursor materials 414, for example Mn(TMSA)$_2$(py)$_2$, from which a process (or other) gas may be generated through a sublimation or vaporization process. Precursor materials 414 comprising a precursor containing at least one Mn—N bond and a 2-electron donor ligand. The housing 420 is generally fabricated from a material substantially inert to the precursor materials 414 and gas produced therefrom, and thus, the material of construction may vary based on gas being produced.

The housing 420 may have any number of geometric forms. In the embodiment depicted in FIG. 1, the housing 420 comprises a cylindrical sidewall 402 and a bottom 432 sealed by a lid 404. The lid 404 may be coupled to the sidewall 402 by welding, bonding, adhesives, or other leak-tight method. Alternately, the joint between the sidewall 402 and the lid 404 may have a seal, o-ring, gasket, or the like, disposed therebetween to prevent leakage from the source canister 300. The sidewall 402 may alternatively comprise other hollow geometric forms, for example, a hollow square tube.

The apparatus in FIG. 1 also has a lining 444 along the bottom 432, according to one or more embodiments of the invention. The lining may comprise a dielectric, or in further embodiments, SiO$_2$, Al$_2$O$_3$, TiO$_2$, silicon carbide, silicon oxycarbide or Ta$_2$O$_5$.

An inlet port 406 and an outlet port 408 are formed through the source canister to allow gas flow into and out of the source canister 300. The ports 406, 408 may be formed through the lid 404 and/or sidewall 402 of the source canister 300. The ports 406, 408 are generally sealable to allow the interior of the source canister 300 to be isolated from the surrounding environment during removal of the source canister 300 from the gas delivery system (not shown). In one embodiment, valves 312, 314 are sealingly coupled to ports 406, 408 to prevent leakage from the source canister 300 when removed from the gas delivery system for recharging of the precursor material 414 or replacement of the source canister 300. Mating disconnect fittings 436A, 436B may be coupled to valves 312, 314 to facilitate removal and replacement of the source canister 300 to and from the gas delivery system 304. Valves 312, 314 are typically ball valves or other positive sealing valves that allow the source canister 300 to be removed from the system efficiently loaded and recycled while minimizing potential leakage from the source canister 300 during filling, transport, or coupling to the gas delivery system. Alternatively, the source canister 300 can be refilled through a refill port (not shown) such as a small tube with a VCR fitting disposed on the lid 404 of the source canister 300. The precursor materials 414, may be introduced into source canister 300 by removing the lid 404 or through one of the ports 406, 408.

The source canister 300 may include at least one baffle 410 disposed within the upper region 418 of the source canister 300. The baffle 410 is disposed between inlet port 406 and outlet port 408, creating an extended mean flow path, thereby preventing direct (i.e., straight line) flow of the carrier gas from the inlet port 406 to the outlet port 408. This has the effect of increasing the mean dwell time of the carrier gas in the source canister 300 and increasing the quantity of sublimated or vaporized precursor gas carried by the carrier gas. Additionally, the baffles 410 direct the carrier gas over the entire exposed surface of the precursor material 414 disposed in the source canister 300, ensuring repeatable gas generation characteristics and efficient consumption of the precursor materials 414. The number, spacing and shape of the baffles 410 may be selected to tune the source canister 300 for optimum generation of precursor gas. For example, a greater number of baffles 410 may be selected to impart higher carrier gas velocities at the precursor material 414 or the shape of the baffles 410 may be configured to control the consumption of the precursor material 414 for more efficient usage of the precursor material.

Optionally, an inlet tube 422 may be disposed in the interior volume 438 of the source canister 300. The tube 422 is coupled by a first end 424 to the inlet port 406 of the source canister 300 and terminates at a second end 426 in the upper region 418 of the source canister 300.

Optionally, the apparatus may contain oil trap 450, as agitation of the precursor material 414 may induce droplets to become entrained in the carrier gas and carried toward the processing chamber 306. To prevent such droplets of liquid 416 from reaching the processing chamber 306, an oil trap 450 may optionally be coupled to the exit port 408 of the source canister 300. The oil trap 450 may include a body 452 containing a plurality of interleaved baffles 454 which extend past a centerline 456 of the oil trap body 452 and are angled at least slightly downward towards the source canister 300. The baffles 454 force the gas flowing towards the processing chamber 306 to flow a tortuous path around the baffles 454. The surface area of the baffles 454 provides a large surface area exposed to the flowing gas to which oil droplets that may be entrained in the gas adhere. The downward angle of the baffles 454 allows any oil accumulated in the oil trap to flow downward and back into the source canister 300.

The precursor materials 414 generate a precursor gas at a predefined temperature and pressure. Sublimating or vaporized gas from the precursor materials 414 may accumulate in the upper region 418 of the source canister 300 and can be swept out by an inert carrier gas entering through inlet port 406 and exiting outlet port 408 to be carried to the processing chamber 306. In one embodiment, the precursor materials 414 are heated to a predefined temperature by a resistive heater 430 disposed proximate to the sidewall 402. Alternately, the precursor materials 414 may be heated by other means, such as by a cartridge heater (not shown) disposed in the upper region 418 or the lower region 434 of the source canister 300 or by preheating the carrier gas with a heater (not shown) placed upstream of the carrier gas inlet port 406.

Deposition Processes

The apparatuses described herein may be utilized during the deposition of manganese-containing films. Accordingly, one aspect of the invention relates to a method of depositing a manganese-containing film using any of the apparatuses described herein for generating a chemical precursor gas. The precursor contained within the apparatus can be used as the manganese source in the film deposition process. One or more embodiments relate vaporizing a precursor described herein in the apparatuses for generating a chemical precursor gas described herein. A substrate surface may then be exposed to the vaporized precursor. In one or more embodiments, the 2-electron donor ligand comprises a pyridine (py), tetrahydrofuran (THF), tetrahydrothiophene, or tetramethylethylenediamine (TMEDA) ligand. In further embodiments, the precursor has a structure represented by:

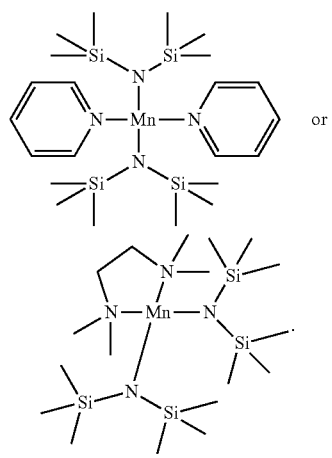

Another aspect of the invention relates to a method of depositing a manganese-containing film, the method comprising: providing a precursor containing at least one Mn—N bond; and flowing the precursor through an ampoule that has a lining comprising an inert metal oxide. The method may be part of any deposition process where an ampoule or other apparatus for generating a chemical precursor gas is used. Thus for example, the method may be a part of a chemical vapor deposition (CVD), atomic layer deposition (ALD), plasma enhanced chemical vapor deposition (PECVD), plasma enhanced atomic layer deposition (PEALD) or other deposition process. The processes described herein may be used to deposit a variety of manganese-containing films, including, but not limited to, MnN and films consisting essentially of manganese. Accordingly, in one or more embodiments, the method further comprises exposing a substrate surface to any of the precursors described herein.

Any of the variants of the described for the apparatus above may also be applied for the method. Thus, for example, in one or more embodiments, the inert metal oxide comprises a dielectric. In further embodiments, the inert metal oxide comprises $SiO_2$, $Al_2O_3$, $TiO_2$, silicon carbide, silicon oxycarbide or $Ta_2O_5$.

As described above, the precursor contains at least one Mn—N bond. In one or more embodiments, the precursor is any one of the stabilized precursors described above. That is, in some embodiments, the precursor further contains a 2-electron donor ligand, which may itself contain the Mn—N bond. In one or more embodiments, the 2-electron donor ligand is a ligand that helps to stabilize the precursor. In some embodiments, the 2-electron donor ligand comprises a pyridine (py), tetrahydrofuran (THF), tetrahydrothiophene, or tetramethylethylenediamine (TMEDA) ligand. In further embodiments, the precursor has a structure represented by:

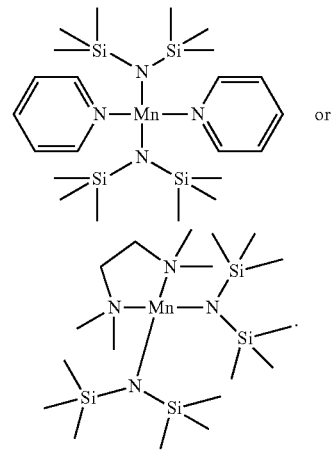

In some embodiments, the precursor has a structure represented by:

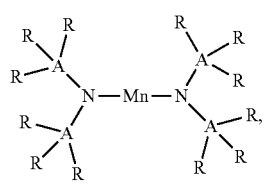

wherein each A is independently selected from carbon or silicon and each R is independently selected from hydrogen, methyl, substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. The oxidation state of the manganese can be in any suitable oxidation state capable of reacting with the substrate or the second precursor. In some embodiments, the manganese is Mn(II) or Mn(III). In one or more embodiments, each A is silicon. In some embodiments, each R group is a methyl. In further embodiments, the precursor comprises manganese bis[bis(trimethylsilyl)amide], which has a structure represented by:

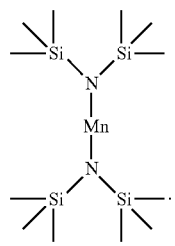

The above precursor can be utilized in the production of manganese (Mn) or manganese nitride ($MnN_x$) from an organometallic precursor. The deposition methods can be atomic layer deposition (ALD) or chemical vapor deposition (CVD). The organometallic precursor may include a manganese silyl amido complex. The deposited manganese or $MnN_x$ film can be used as an alternative diffusion barrier in the back-end-of-line copper interconnections to replace currently used PVD TaN or ALD TaN. The deposition approach can be integrated with the ALD TaN deposition to generate manganese doped TaN or tantalum doped with $MnN_x$. Other dopants may also be utilized. In one or more embodiments, the barrier layer comprises 0.1 to 10% dopant, based on the weight of the manganese layer. In some embodiments, the barrier layer comprises 0.2 to 8 wt. % dopant. In particular embodiments, the barrier layer comprises 0.5 to 5 wt. % dopant.

In some embodiments, the substrate is exposed to a first precursor and a second precursor. Accordingly, in one or more embodiments, the method further comprises exposing a substrate surface to the manganese bis[bis(trimethylsilyl)amide] and to a second precursor comprising $NH_3$. The exposure to these precursors can be substantially simultaneously, as in a CVD reaction, or sequentially, as in an ALD reaction. As used in this specification and the appended claims, the term "substantially simultaneously" means that the two precursor gases are at least partially co-flowed into the chamber to react with each other and the substrate surface together. It will be understood by those skilled in the art that there may be areas of the substrate which are briefly exposed to one precursor only until the other precursor diffuses to the same area.

In some embodiments, the Mn precursor can be used with one or more additional precursors. Examples include ammonia and hydrogen. Therefore, as an example, if ammonia is used, a manganese nitride film can be formed. Whereas, it hydrogen is used as the second precursor, a film consisting essentially of manganese can be formed.

In some embodiments, the manganese film comprises $MnN_x$. The x of some embodiments is in the range of about 0.1 to about 3, or in the range of about 0.2 to about 2, or in the range of about 0.25 to about 1. In some embodiments, the film comprises manganese silicate and may be formed on the dielectric layer. In one or more embodiments, the manganese film comprises manganese silicate when deposited near a dielectric surface and manganese nitride further from the surface. The transition from the silicate to the nitride can be gradual or in discrete steps.

The films in accordance with various embodiments of this invention can be deposited over virtually any substrate material. A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

As embodiments of the invention provide a method for depositing or forming doped manganese-containing films, a processing chamber is configured to expose the substrate to a sequence of gases and/or plasmas during the vapor deposition process. The processing chamber would include separate supplies of reactants, along with any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a deposition process as described herein. The central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

The co-reactants are typically in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, the gases can flow simultaneously through gas supply nozzle or head and the substrate and/or the gas supply head can be moved so that the substrate is sequentially exposed to the gases.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer.

In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated externally from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not required.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

EXAMPLES

Example 1

Two manganese precursors were placed in containers either lined with stainless steel or $SiO_2$ according to the following table:

| Example | Precursor | Lining |
|---|---|---|
| Example 1A (Comparative) | $Mn(TMSA)_2$ | Stainless Steel |
| Example 1B | $Mn(TMSA)_2$ | $SiO_2$ |
| Example 1C | $Mn(TMSA)_2(py)_2$ | Stainless Steel |
| Example 1D | $Mn(TMSA)_2(py)_2$ | $SiO_2$ |

All samples were heated to a temperature of 90° C. for a period of 18 days, and the percentage of non-volatile residue was measured at varying intervals through the 18 day period. One of the manganese precursors contained two bis(trimethylsilyl)amide (TMSA) ligands. The other contained two TMSA ligands and two pyridine (py) ligands, and is referred to as "stabilized." The examples with stainless steel represent conventional ampoules, which are commonly lined with stainless steel. The examples with $SiO_2$ simulate ampoules with a lining. The percent of non-volatile residue represents the amount of precursor that is lost due to reaction with the surface. That is, the higher the percentage of non-volatile residue, the more precursor has been lost. Accordingly a lower percentage is desired.

Figure 2:
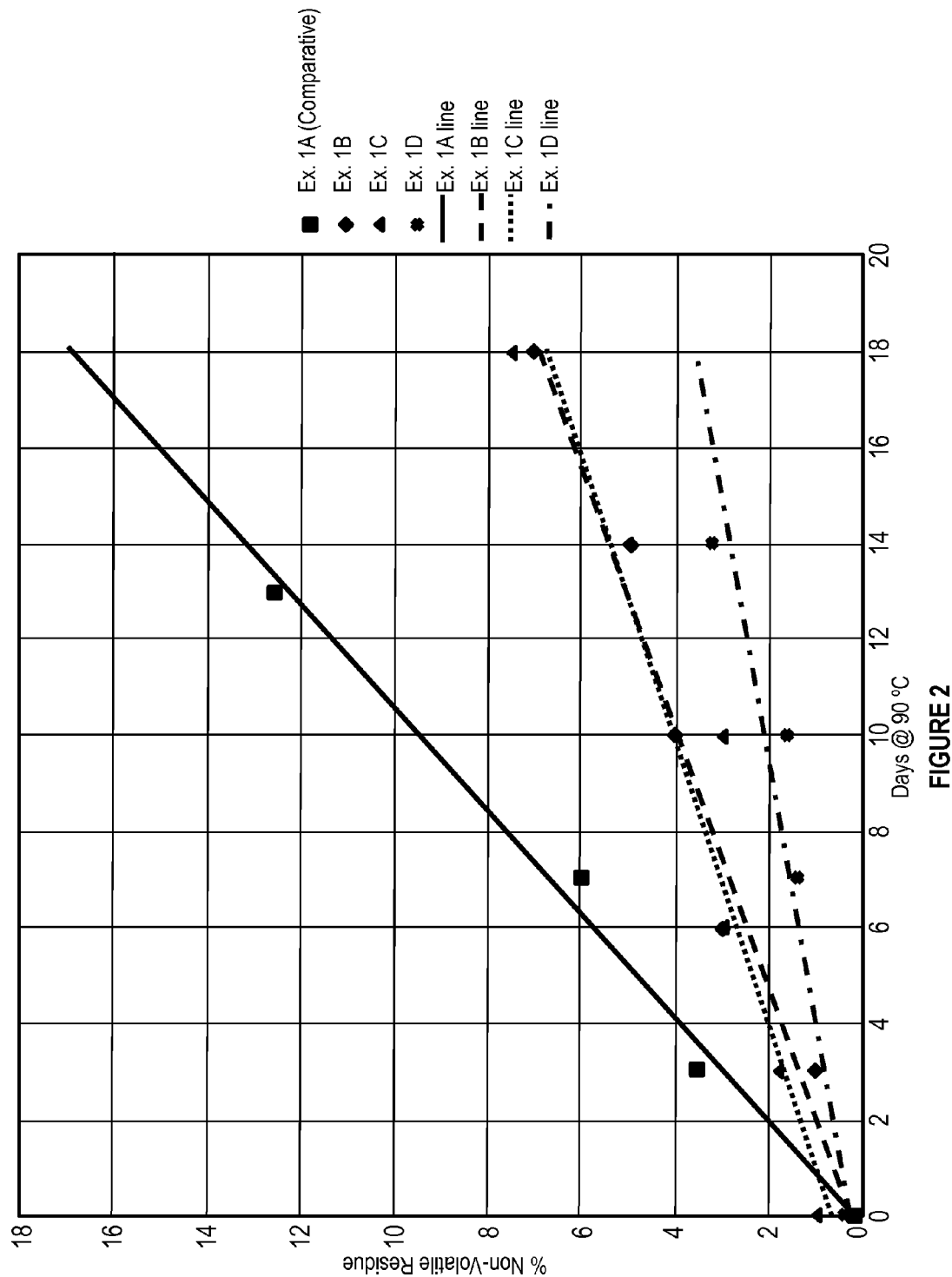
FIG. 2 is a graph showing the percent non-volatile residue of one comparative examples and three examples in accordance with one or more embodiments of the invention.

FIG. 2 is a graph showing the percent non-volatile residue over the 18 day period, including trend lines based on the data points. Example 1A, which contained $Mn(TMSA)_2$ in a heated stainless steel container, provides a baseline process, as the container did not contain a lining and the precursor did not contain extra stabilizing ligands. It thus also serves as a baseline for comparison against the other examples. As seen from the figure, by the 18th day, there was about 17% non-volatile residue. By comparison, the lined container with the same precursor (Example 1B) exhibited only about 7% non-volatile residue, corresponding to a drop of more than half Example 1C, which features a stabilized precursor in a stainless steel container, performed comparably to the unstabilized precursor in a lined container of Example 1B. That is, after 18 days, Example 1C exhibited about 7.5% non-volatile residue, which is still less than half that exhibited in Example 1A. Example 1D, which featured both a stabilized precursor and lined container, exhibited the best results. After 18 days, extrapolation of the data for Example 1D shows that the % of non-volatile residue would be expected to be about 3.5%, lower than Examples 1B and 1C, and significantly lower than Example 1A. The advantages of stabilizing the precursor and/or lining the ampoule are evident from these examples.

Example 2

$Mn(TMSA)_2$ precursor was placed into several containers with different linings and heated to a temperature of 90° C. to 20 days, according to the following table:

| Example | Precursor | Lining |
|---|---|---|
| Example 2A | $Mn(TMSA)_2$ | $SiO_2$ |
| Example 2B | $Mn(TMSA)_2$ | Dursan ™ |
| Example 2C | $Mn(TMSA)_2$ | Silcolloy ™ |
| Example 2D (Comparative) | $Mn(TMSA)_2$ | Stainless Steel |

Figure 3:
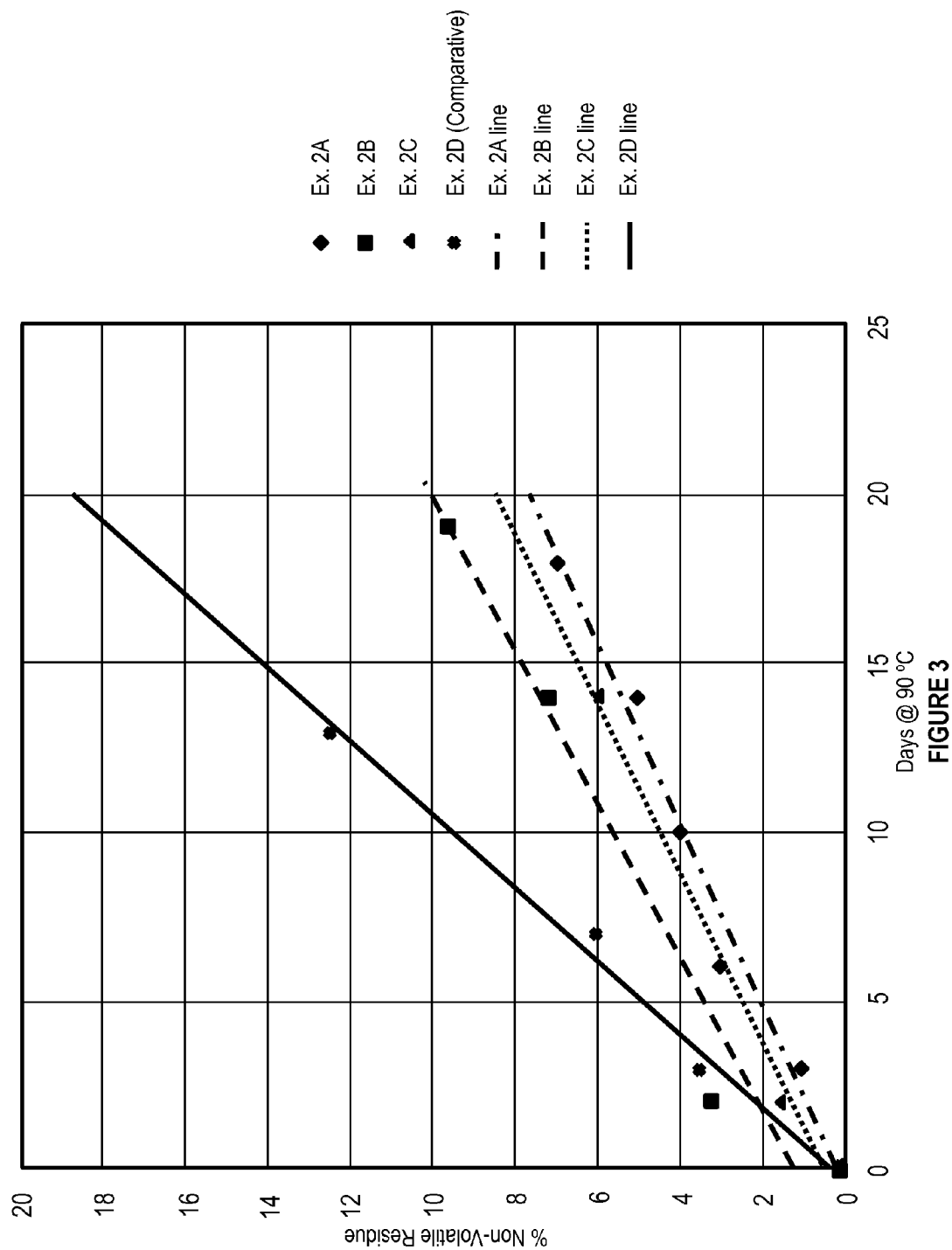
FIG. 3 is a graph showing the percent non-volatile residue of one comparative examples and three examples in accordance with one or more embodiments of the invention.

Dursan™ and Silcolloy™ refer to stainless steel tags coated with two different silicon-based anti-corrosion coatings. These tags were included with a sample in a glass container, the same as 2A, and were to simulate a lined SST ampoule by placing the $Mn(TMSA)_2$ in contact with coated stainless steel. The heated containers simulate a the conditions experienced with a heated ampoule. The percent non-volatile residue was measured for each of the samples at various intervals. FIG. 3 is a graph showing the percent non-volatile residue over the 20 day period, including trend lines of the data points. As evidenced by the figure, the various metal oxide-lined containers greatly reduced the percent non-volatile residue.

Example 3

Comparative

Figure 4:
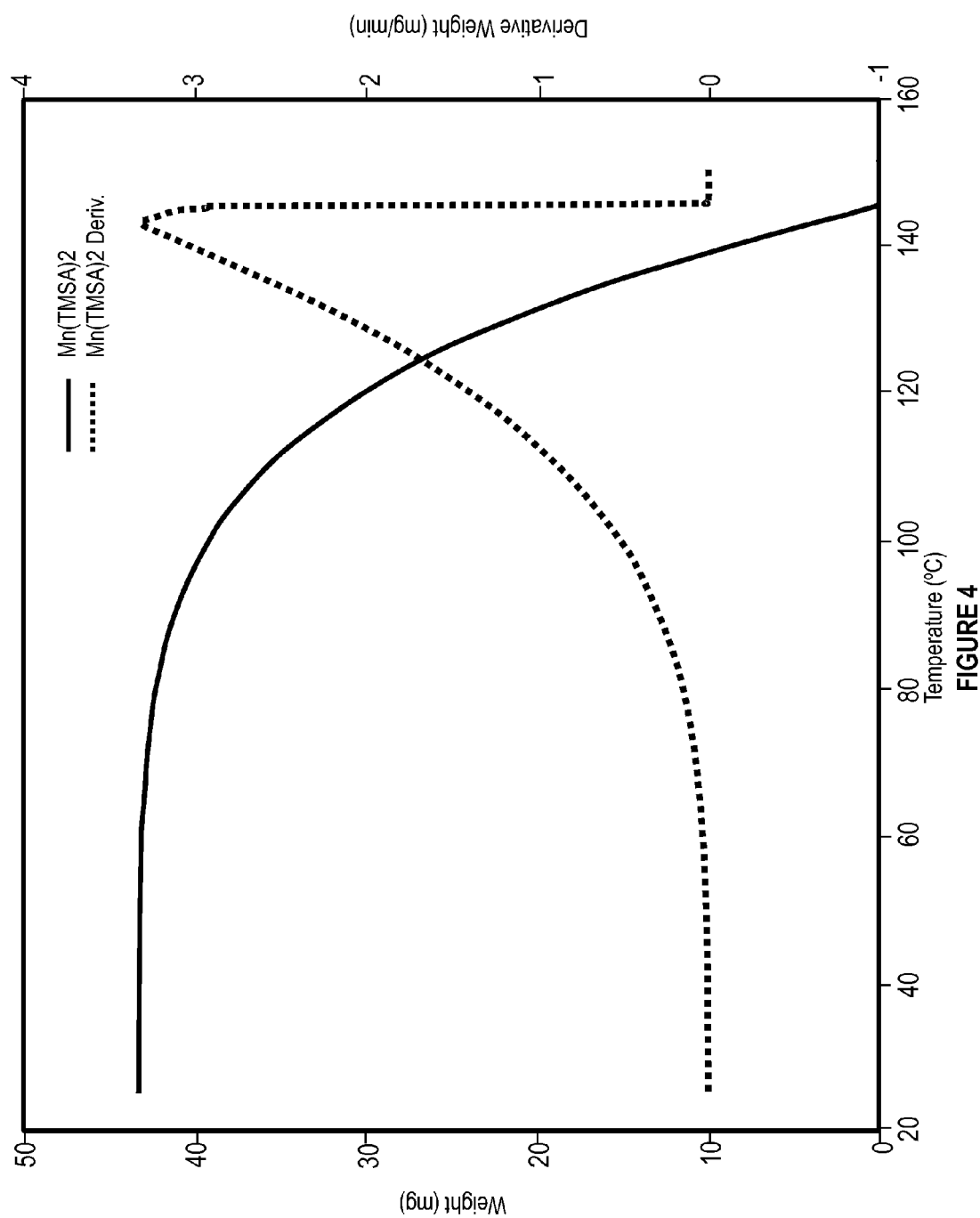
FIG. 4 is a thermogravimetric curve of $Mn(TMSA)_2$.

FIG. 4 is a thermogravimetric analysis curve of $Mn(TMSA)_2$, as well as its derivative. The weight of the precursor was measured as function of temperature. A small amount of precursor was steadily ramped 2° C./minute. The solid curve represents the weight, and the dotted curve represents the time derivative of the weight, providing the rate of mass loss (i.e, vaporization) at a given temperature.

Example 4

Figure 5:
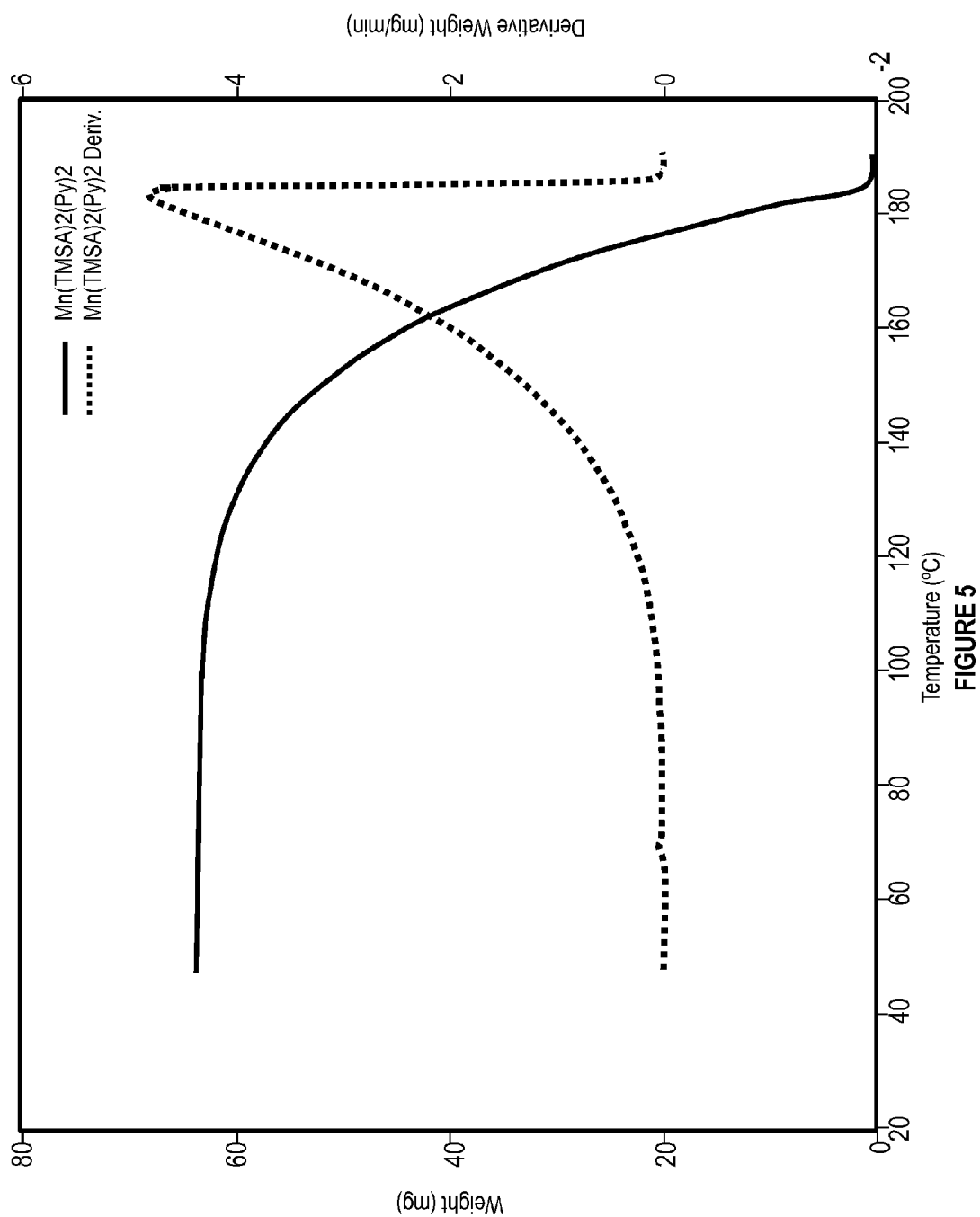
FIG. 5 is a thermogravimetric curve of $Mn(TMSA)_2(py)_2$.

Example 4 repeated the experiment of Example 3, except that the precursor was $Mn(TMSA)_2(py)_2$, considered to be a stabilized precursor. Again, the solid curve represents the weight, and the dotted curve represents the derivative of the weight, providing the rate of mass loss (i.e, vaporization) at a given temperature. FIG. 5 shows the thermogravimetric analysis curve and derivative. As can be seen from the figure, the stabilized precursor with pyridine ligands has increased stability as compared to the $Mn(TMSA)_2$.

Example 5

Figure 6:
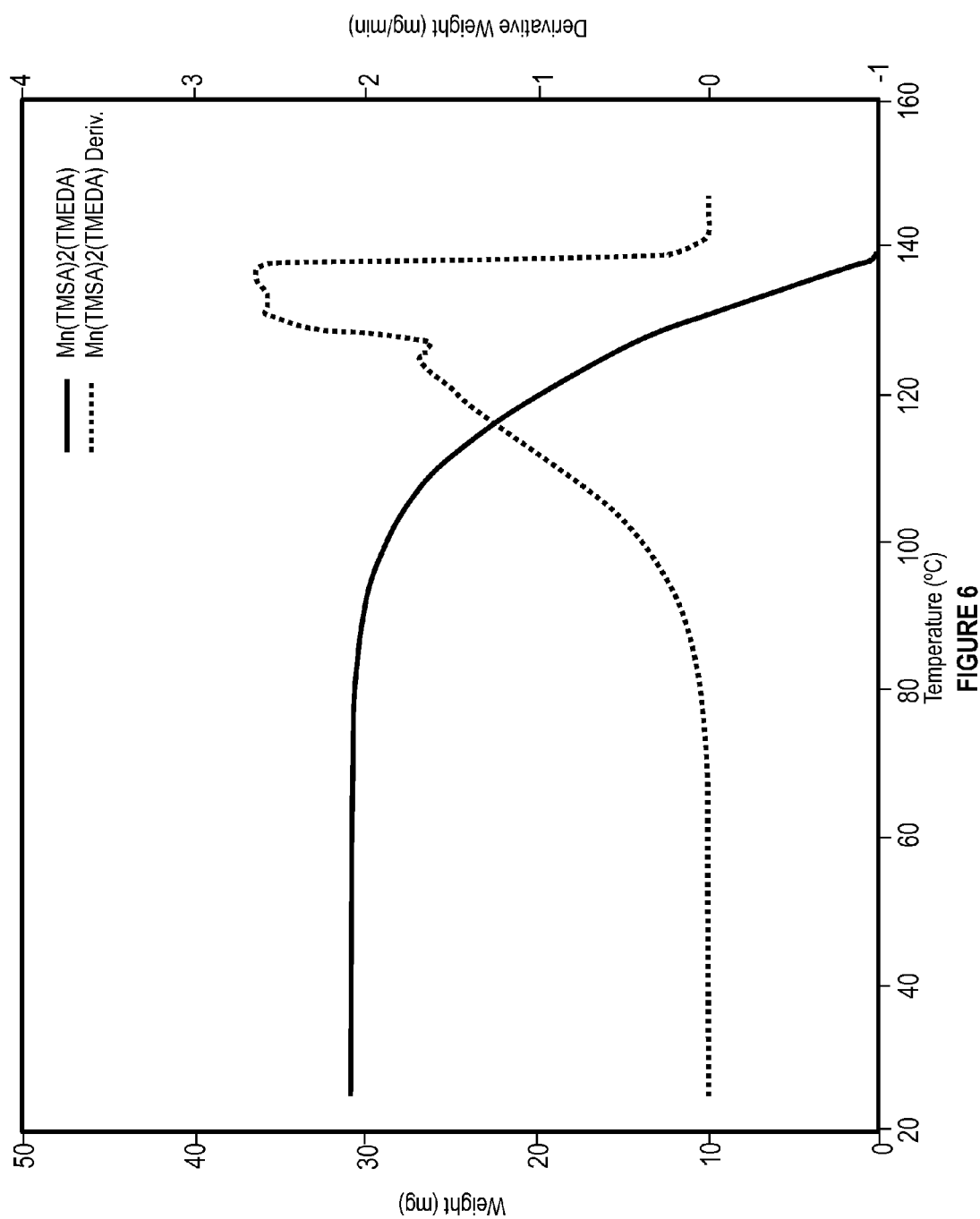
FIG. 6 is a thermogravimetric curve of $Mn(TMSA)_2(TMEDA)_2$.

Example 5 repeated the experiment of Example 3, except that the precursor was $Mn(TMSA)_2(TMEDA)$, considered to be a stabilized precursor. Again, the solid curve represents the weight, and the dotted curve represents the derivative of the weight, providing the rate of mass loss (i.e, vaporization) at a given temperature. FIG. 6 shows the thermogravimetric analysis curve and derivative. As can be seen from the figure, the stabilized precursor has increased stability as compared to the $Mn(TMSA)_2$. Additionally, the TMEDA-stabilized precursor does not have any significant loss of volatility as compared to Mn(TMSA)$_2$. The peaks shown in the derivative curve may mean there is some decomposition occurring at those temperatures, but the fact that the mass curve goes to zero means the products of that decomposition are still volatile, and may be acceptable.

What is claimed is:

1. An apparatus for generating a chemical precursor gas, the apparatus comprising:
   a canister having a sidewall, a top, and a bottom forming an interior volume;
   an inlet port and an outlet port in fluid communication with the interior volume;
   a lining on at least part of the sidewall, top or bottom, wherein the lining comprises an inert metal oxide; and
   a precursor in the interior volume of the canister, wherein the precursor contains at least one Mn—N bond and a 2-electron donor ligand.

2. The apparatus of claim 1, wherein the lining is on at least part of the bottom.

3. The apparatus of claim 1, wherein the inert metal oxide comprises a dielectric.

4. The apparatus of claim 1, wherein the inert metal oxide comprises SiO$_2$, Al$_2$O$_3$, TiO$_2$, silicon carbide, silicon oxycarbide or Ta$_2$O$_5$.

5. The apparatus of claim 1, wherein the 2-electron donor ligand comprises pyridine, tetrahydrofuran or tetrahydrothiophene, tetramethylethylenediamine, acetonitrile, a tertiary amine or 2,2'-bipyridyl.

6. The apparatus of claim 5, wherein the precursor has a structure represented by:

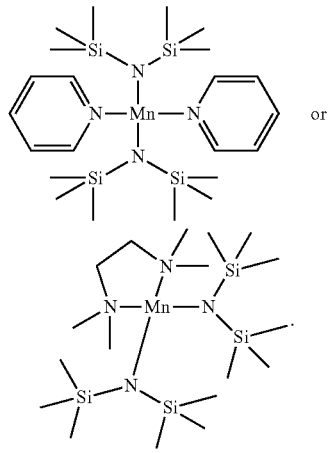

or

* * * * *